(12) United States Patent
Thomsen (10) Patent No.: US 8,878,570 B2
(45) Date of Patent: Nov. 4, 2014

(54) CONFIGURABLE ANALOG FRONT END (75) Inventor: Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/249,349

(22) Filed: Sep. 30, 2011

(65) Prior Publication Data

US 2013/0082740 A1 Apr. 4, 2013

(51) Int. Cl.
*H03K 3/00* (2006.01)
*H04L 27/00* (2006.01)
*H03K 5/00* (2006.01)

(52) U.S. Cl.
CPC ............ *H03K 5/00* (2013.01); *H04L 27/0002* (2013.01)
USPC ............... 327/108; 327/63; 327/65; 341/141; 341/153

(58) Field of Classification Search
USPC .................................................. 327/108, 109
See application file for complete search history.

(56) References Cited

U.S. PATENT DOCUMENTS

| | | | | |
|---|---|---|---|---|
| 3,688,129 A * | 8/1972 | Ishigaki et al. | ............... | 327/306 |
| 5,543,706 A * | 8/1996 | Rolff | ............................ | 324/115 |
| 6,414,619 B1 * | 7/2002 | Swanson | ........................ | 341/155 |
| 6,466,090 B1 * | 10/2002 | Giuroiu | ............................ | 330/86 |
| 6,683,706 B1 * | 1/2004 | Keithley | ........................ | 358/514 |
| 7,280,058 B1 * | 10/2007 | Zhu et al. | ........................ | 341/110 |
| 2002/0171773 A1 * | 11/2002 | Gower et al. | ................. | 348/691 |
| 2006/0082484 A1 * | 4/2006 | Linder et al. | ................... | 341/155 |
| 2007/0195074 A1 * | 8/2007 | Gelissen | ........................ | 345/204 |
| 2007/0258008 A1 * | 11/2007 | Kameshima et al. | ......... | 348/372 |
| 2011/0092834 A1 * | 4/2011 | Yazicioglu et al. | ........... | 600/509 |

OTHER PUBLICATIONS

Cirrus Logic, CS3301A Data Sheet, Mar. 2007.*
Analog Devices AD8638 Data Sheet Rev. F Oct. 2010.*
"Programmable System-on-Chip (PSoC®), Preliminary PSoC® CY8C53 Family Datasheet, Cypress Semiconductor Corporation, Cypress Perform" No. 001-66237 Rev. *B, Revised Sep. 1, 2011, pp. 1-2 and Section 8, pp. 43-50.

* cited by examiner

*Primary Examiner* — Lincoln Donovan
*Assistant Examiner* — Patrick Chen
(74) *Attorney, Agent, or Firm* — Abel Law Group, LLP (57) ABSTRACT

An integrated circuit includes a configurable interface. The configurable interface includes an operational amplifier, a programmable gain amplifier, an analog-to-digital converter and a first select circuit. The first select circuit is configured to selectively couple the operational amplifier to the analog-to-digital converter in response to a first control signal. The first select circuit is further configured to selectively couple the programmable gain amplifier to the analog-to-digital converter in response to the first control signal.

20 Claims, 9 Drawing Sheets

CONFIGURABLE ANALOG FRONT END

BACKGROUND

1. Field of the Invention

This invention relates to integrated circuits and more particularly to interface circuits included on mixed-signal integrated circuits.

2. Description of the Related Art

In general, a mixed-signal integrated circuit includes both analog and digital circuits on a single integrated circuit die and is typically designed for a specific target application. For example, a mixed-signal integrated circuit includes an interface circuit (i.e., analog front end circuit) designed to convert an analog signal to a digital form. Digital circuitry included on that mixed-signal integrated circuit then performs a specific function, e.g., a function or sub-function of a radio subsystem of a mobile communications device. A general purpose, mixed-signal integrated circuit can be achieved by including a conventional general purpose processor (e.g., microprocessor or microcontroller) and memory.

SUMMARY

In at least one embodiment of the invention, an integrated circuit includes a configurable interface. The configurable interface includes an operational amplifier, a programmable gain amplifier, an analog-to-digital converter and a first select circuit. The first select circuit is configured to selectively couple the operational amplifier to the analog-to-digital converter in response to a first control signal. The first select circuit is further configured to selectively couple the programmable gain amplifier to the analog-to-digital converter in response to the first control signal.

In at least one embodiment of the invention, a method includes, in a first mode of operation, processing a received signal using a first amplifier. The method includes, in a second mode of operation, processing the received signal using a second amplifier. The method includes, in a third mode of operation, processing the received signal using the first amplifier and the second amplifier. The method includes providing a processed version of the received signal to an analog-to-digital converter.

In at least one embodiment of the invention, an analog front end includes an analog-to-digital converter. The analog front end includes a circuit configured to convert a received signal to a signal format associated with the analog-to-digital converter. In a first mode of the analog front end, the received signal is a current signal. In a second mode of the analog front end, the received signal is a ground-referenced signal. In a third mode of the analog front end, the received signal is a large voltage signal. In a fourth mode of the analog front end, the received signal is a wide swing, common mode signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE PREFERRED EMBODIMENT(S)

Figure 1:
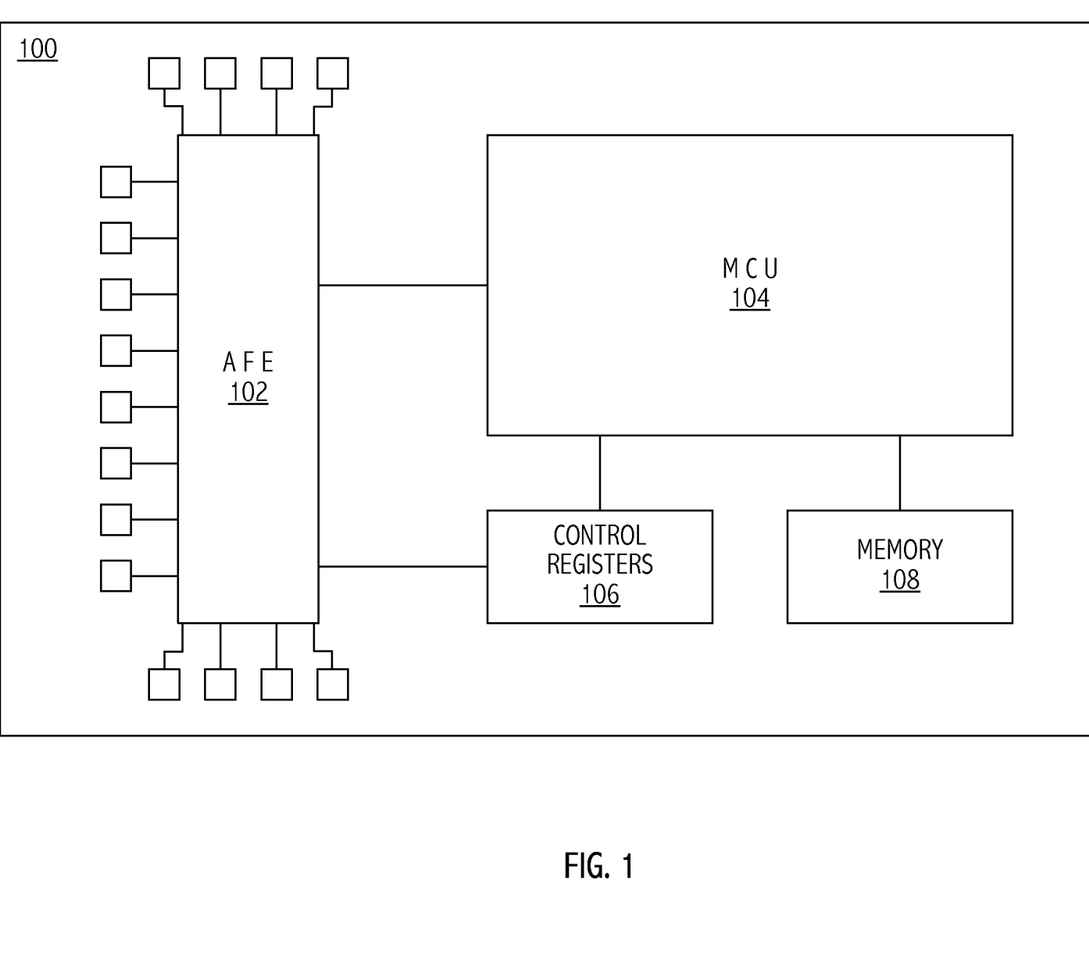
FIG. 1 illustrates a functional block diagram of a general purpose mixed-signal integrated circuit consistent with at least one embodiment of the invention.

Referring to FIG. 1, a general purpose, mixed-signal integrated circuit (e.g., integrated circuit 100) includes a general purpose processor (e.g., microcontroller unit (MCU) 104). In at least one embodiment, integrated circuit 100 is responsive to off-chip analog signals received via an interface circuit (e.g., analog front end (AFE) 102). In at least one embodiment, microcontroller unit 104 processes digital versions of those analog signals according to an application-specific configuration. In at least one embodiment of integrated circuit 100, the application-specific configuration includes user preferences and instructions, which may be stored on integrated circuit 100 (e.g., in control registers 106 and memory 108) based on factory-determined settings and/or settings provided by an end-user via terminals of integrated circuit 100.

In at least one embodiment, integrated circuit 100 is configured to process signals generated by sensor devices. In general, a sensor device measures a physical quantity (e.g., vibration, position, speed, acceleration, pressure, temperature, force, etc.) and converts it into an electrical signal that may be processed by integrated circuit 100. Signals that are generated by different sensor devices can vary dramatically from each other. In general, various sensor devices have outputs that might have a high impedance or a nominal impedance and/or the sensor output signals are output current signals (i.e., the current of the output signal is proportional to the value or simple function of the measured physical quantity), small signals, have a wide common mode range, or are ground-referenced signals. For example, current sense resistors have a low output impedance and provide output signals having a high common mode voltage and small signal voltages, piezoelectric transducers have a high output impedance and provide large signal output signals, pin-diodes have a high output impedance and provide current output signals, Hall-effect sensors have a moderate output impedance and provide small signal output signals, and resistor bridges for sensing temperature, strain, or pressure have a moderate output impedance and provide small signal output signals. Although a typical analog front end includes a receiving amplifier that converts a received signal to a signal having a target format specified for an analog-to-digital converter circuit, the typical receiving amplifier cannot properly convert all of those aforementioned signal types into a signal having the target format and rather is tailored to convert signals having types that are a subset of those signal types into the target format.

Figure 2:
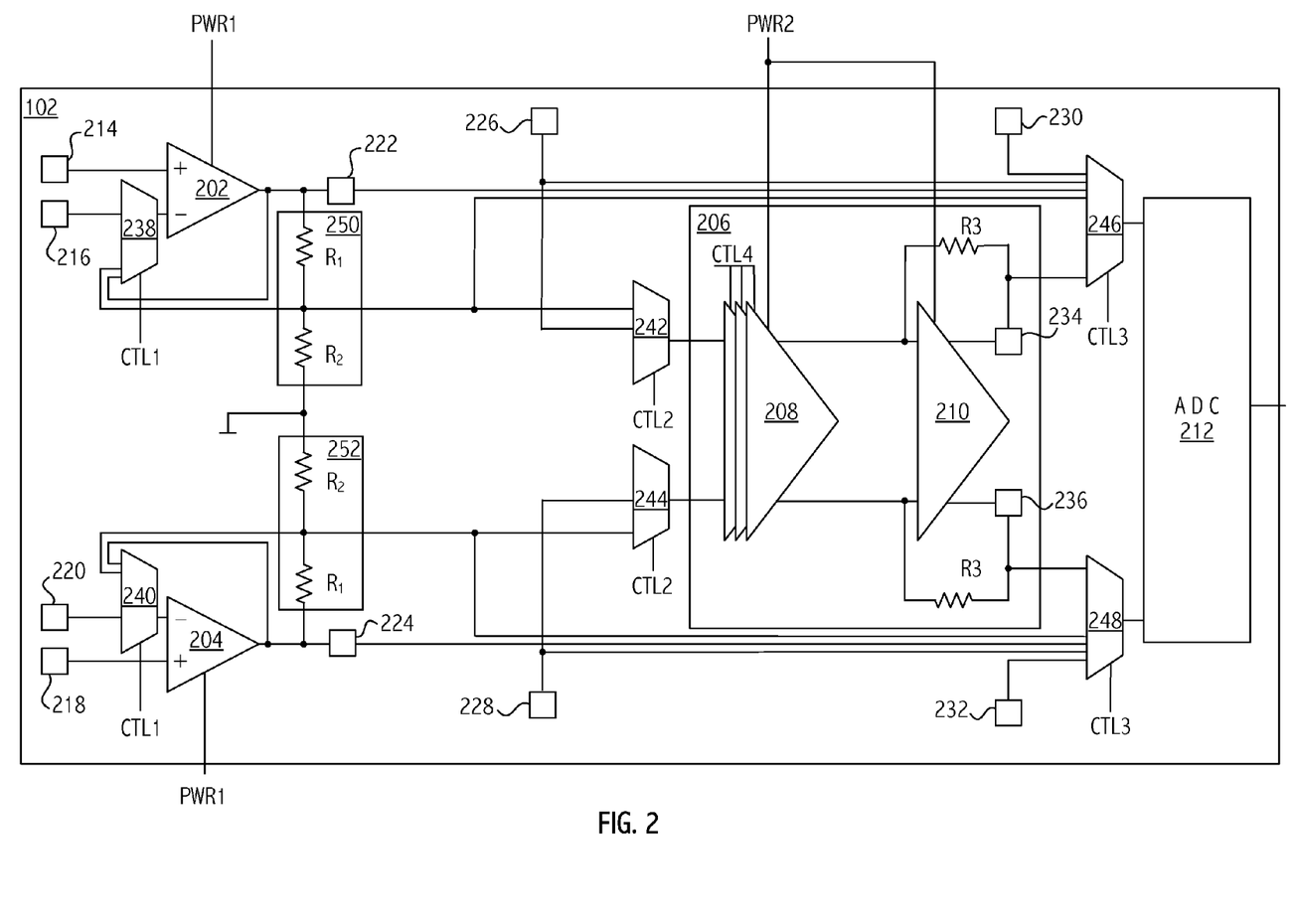
FIG. 2 illustrates a functional block diagram of a configurable interface circuit consistent with at least one embodiment of the invention.

Referring to FIGS. 1 and 2, in at least one embodiment of integrated circuit 100, configurable interface 102 receives an off-chip signal (e.g., from a sensor device) and converts the received signal to a target signal format usable by an analog-to-digital converter (e.g., ADC 212). For example, a typical ADC has a particular input sampling capacitance, a particular sampling frequency, a particular input impedance and a particular input current. Thus, the typical ADC may not conveniently interface to high impedance sensors. In addition, the typical ADC has a noise floor and quantization error that may make direct measurements of small signals inaccurate. In addition, the typical ADC may have a limited input voltage range. Accordingly, large common mode signal components or common mode signal components outside the ADC input voltage range should be removed in some situations (e.g., depending on the performance characteristics of the ADC) before applying the signal. In at least one embodiment, ADC 212 is designed to receive a voltage signal format used by a typical successive approximation analog-to-digital converter, or other suitable signal format used by another suitable analog-to-digital converter type. In general, ADC 212 provides a digital representation of the received signal to MCU 104 for further processing. In at least one embodiment, ADC 212 is a typical successive approximation analog-to-digital converter (SAR ADC). In at least one embodiment, the SAR ADC includes a sample-and-hold circuit configured to acquire the input voltage. An analog comparator in the SAR ADC compares the input voltage to an output of an internal digital-to-analog converter and provides the results of the comparison to a successive approximation register. The successive approximation register of the SAR ADC generates an approximate digital code corresponding to the input voltage, which is provided to the internal digital-to-analog converter. The internal digital-to-analog converter generates an analog voltage equivalent of the digital code output of the successive approximation register for comparison with the input voltage. In at least one embodiment, configurable interface 102 properly generates the digital representation of a received signal whether the received signal is a current signal, the received signal is a small signal, the received signal has a wide common mode range (e.g., rail-to-rail common mode voltages), or the received signal is a ground-referenced signal (which includes signals with below-ground potentials).

In at least one embodiment, configurable interface 102 includes an operational amplifier (e.g., operational amplifiers 202 and 204) and a programmable gain amplifier (e.g., programmable gain amplifier 206, which in at least one embodiment includes multiple operational amplifier stages 208 and 210). In at least one embodiment, configurable interface 102 includes multiple select circuits, e.g., multiplexers 238 and 240, multiplexers 242 and 244, and multiplexers 246 and 248, that selectively provide inputs to operational amplifiers 202 and 204, programmable gain amplifier 206, and ADC 212, respectively, in response to corresponding control signals, e.g., CTL1, CTL2, and CTL3, respectively. In at least one embodiment of configurable interface 102, rather than use multiplexers that are controlled by a single control signal, the select function is implemented using multiple switches coupled between an output node and corresponding input signals. Each of those switches is separately controlled by a corresponding control signal. In at least one embodiment, configurable interface 102 includes attenuators 250 and 252, which interface operational amplifiers 202 and 204, respectively, to corresponding inputs of programmable gain amplifier 206.

In at least one embodiment, configurable interface 102 includes terminals (e.g., pads 214, 216, 218, . . . , 232 or other input and/or output coupling mechanisms) of integrated circuit 100 that facilitate communication of signals between off-chip devices (i.e., devices external to the integrated circuit including configurable interface 102) and nodes of configurable interface 102. In at least one embodiment of configurable interface 102, pads 214, 216, and 222 provide off-chip access to input and output ports of operational amplifier 202. Similarly, pads 218, 220, and 224 provide off-chip access to the input and output ports of operational amplifier 204. In at least one embodiment of configurable interface 102, pads 226, 228, 234, and 236 provide off-chip access to the input and output ports of programmable gain amplifier 206. In at least one embodiment of configurable interface 102, pads 230 and 232 provide off-chip access to the inputs of ADC 212.

In at least one embodiment of configurable interface 102, operational amplifiers 202 and 204 each have a high input impedance and low input leakage. In at least one embodiment of configurable interface 102, each of operational amplifiers 202 and 204 can be configured as a standalone operational amplifier. In at least one embodiment of configurable interface 102, operational amplifiers 202 and 204 are designed to receive voltage signals having rail-to-rail (i.e., wide) input common mode range. In at least one embodiment of configurable interface 102, operational amplifiers 202 and 204 have a high input impedance in order to interface with high input impedance sensors, e.g., piezoelectric sensors or pin diodes. As discussed above, in at least one embodiment of configurable interface 102, the inputs and outputs of operational amplifiers 202 and 204 are accessible off-chip and select circuits 238 and 240 configure operational amplifiers 202 and 204, respectively, to perform various functions in response to control signal CTL1.

Figure 3A:
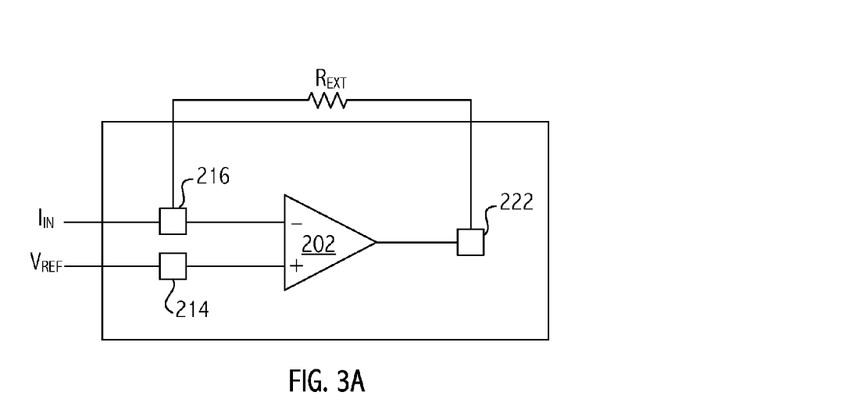
FIGS. 3A-3C illustrate exemplary configurations of an operational amplifier of the configurable interface circuit of FIG. 2 consistent with at least one embodiment of the invention.

Referring to FIGS. 2 and 3A, in at least one embodiment of configurable interface 102, CTL1 selectively configures select circuit 238 to couple pad 216 to the inverting terminal of operational amplifier 202 for a configuration in which the non-inverting terminal receives a bias voltage (e.g., $V_{REF}$ may be equal to approximately $V_{DD}/2$) via pad 214 and the inverting terminal receives input current via pad 214, thereby configuring operational amplifier 202 as a transimpedance amplifier that converts input current to output voltage. In at least one embodiment of the transimpedance amplifier, an external resistance (e.g., $R_{EXT}$) coupled between the output terminal and the inverting input terminal of operational amplifier 202 via pads 222 and 226 is large (e.g., a resistance on the order of mega-Ohms (MΩ)) and may vary based on the characteristics of the input signal. However, in other embodiments of configurable interface 102, a resistance having a fixed or programmable value is integrated on-chip and selectively coupled to the non-inverting input and output terminals of operational amplifier 202.

Figure 3B:
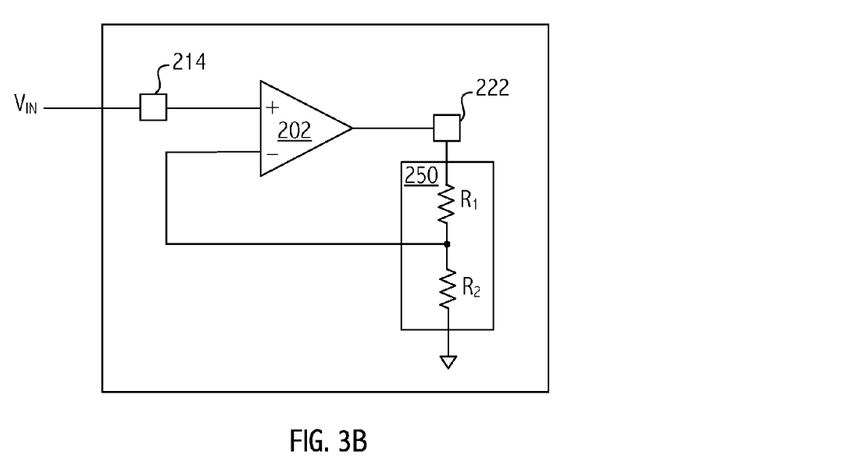
Figure 3C:
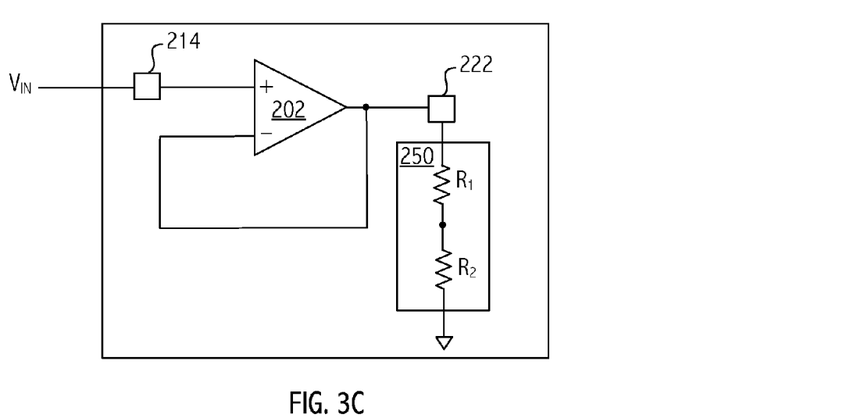

Referring to FIGS. 2 and 3B, in at least one embodiment of configurable interface 102, CTL1 selectively configures select circuit 238 to couple the inverting input of operational amplifier 202 to the output of an attenuator module (e.g., voltage divider 250, which, in at least one embodiment, attenuates the output signal of operational amplifier 202 by a factor of approximately two or three), thereby configuring operational amplifier 202 as a buffer that provides some gain to a voltage signal (e.g., $V_{IN}$) received on the non-inverting input via pad 214. In at least one embodiment, the amount of gain is based on resistances $R_1$ and $R_2$, which are selectable, e.g., using values stored in configuration registers. Referring to FIGS. 2 and 3C, in at least one embodiment of configurable interface 102, CTL1 selectively configures select circuit 238 to couple the inverting input of operational amplifier 202 to the output of operational amplifier 202, thereby configuring operational amplifier as a unity gain buffer that receives an input voltage signal (e.g., $V_{IN}$) on the non-inverting input via pad 214. In at least one embodiment of configurable interface 102, operational amplifier 202 is configured as a unity gain buffer and attenuator 250 provides an attenuated version of the output of operational amplifier 202 to PGA 206 or ADC 212. Note that although FIGS. 3A-3C describe configurations with respect to operational amplifier 202, those configurations also apply to operational amplifier 204, which receives a complement of the signal received by operational amplifier 202.

Referring back to FIG. 2, in at least one embodiment of configurable interface 102, programmable gain amplifier 206 is a low noise, low voltage offset amplifier that can sufficiently process ground-referenced signals, signals with below-ground potentials, and small signals to generate a voltage signal at suitable levels for ADC 212. In at least one embodiment, programmable gain amplifier 206 amplifies small signals with high gain (e.g., a gain of up to multiple orders of magnitude). In at least one embodiment, programmable gain amplifier 206 is DC-stabilized using well-known offset reduction techniques, e.g., chopper-stabilization, auto-zeroing, a combination thereof, or other suitable DC stabilization technique. In general, DC-stabilization reduces the voltage offset of programmable gain amplifier 206 two to three orders of magnitude as compared to other operational amplifiers (e.g., operational amplifiers 202 and 204). For example, a typical operational amplifier (e.g., operational amplifiers 202 and 204) has milli-Volts of voltage offset, and at least one embodiment of programmable gain amplifier 206 has a maximum of approximately several micro-Volts of voltage offset. In at least one embodiment of programmable gain amplifier 206, as a result of these DC stabilization techniques, the input impedance of programmable gain amplifier 206 degrades from that of operational amplifiers 202 and 204 (e.g., from giga-Ohms to mega-Ohms).

In at least one embodiment, programmable gain amplifier 206 includes a plurality of amplifier stages, e.g., first amplifier stage 208 and second amplifier stage 210. In at least one embodiment, first amplifier stage 208 includes at least one transconductance amplifier that converts a differential input voltage into an output current. In at least one embodiment, first amplifier stage 208 has a gain that is controllable by external signals (e.g., CTL4). In at least one embodiment, first amplifier stage 208 includes a plurality of transconductance amplifiers, each of which is selectively enabled by CTL4 according to a predetermined target amount of gain. For example, an increased number of enabled transconductance amplifiers increases the gain (i.e., increases the current generated by first amplifier stage 208). In at least one embodiment, second amplifier stage 210 is a transimpedance amplifier that converts the current into a voltage for use by ADC 212. In at least one embodiment, programmable gain amplifier 206 has an offset voltage of less than approximately 10 µV, an offset drift (as a function of temperature) of less than approximately 100 nV/C, an input common mode range of ($V_{DD}$–1V) to (GND–0.3V), and introduces noise of approximately 10 nV/rtHz or less. Note that those specifications are exemplary only and other embodiments of programmable gain amplifier 206 may have different specifications.

Figure 4A:
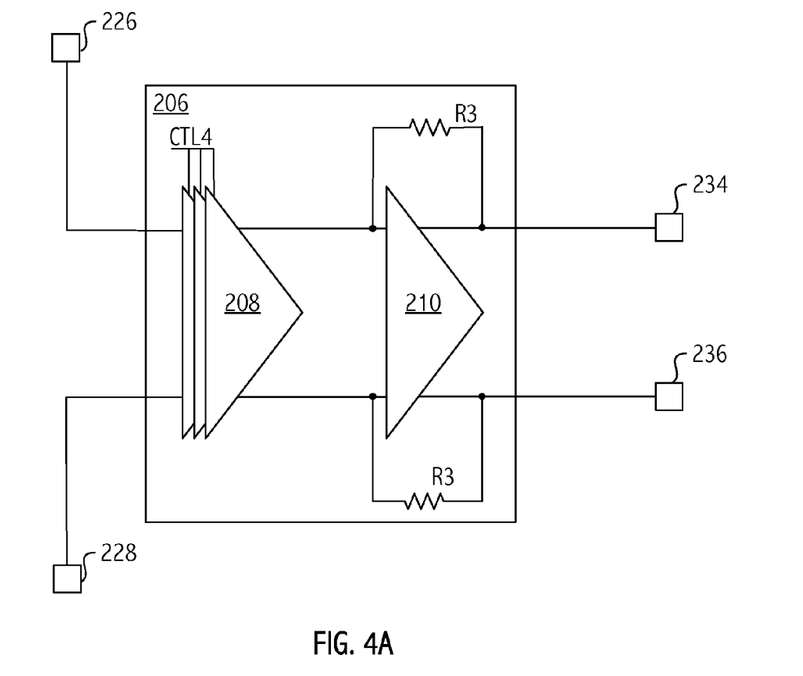
FIGS. 4A and 4B illustrate exemplary configurations of the programmable gain amplifier of the configurable interface circuit of FIG. 2 consistent with at least one embodiment of the invention.

Still referring to FIG. 2, as discussed above, in at least one embodiment of configurable interface 102, the inputs and outputs of programmable gain amplifier 206 are accessible off-chip and select circuits 242 and 244 selectively provide a suitable signal to programmable gain amplifier 206 in response to control signal CTL2. For example, referring to FIGS. 2 and 4A, in at least one embodiment of configurable interface 102, CTL2 selectively configures select circuits 242 to couple the input terminals of programmable gain amplifier 202 to pads 226 and 228, thereby configuring programmable gain amplifier 202 to receive a signal directly from off-chip. In that configuration, programmable gain amplifier 206 shifts a common mode range of the received signal to a common mode range expected by ADC 212. In at least one embodiment of programmable gain amplifier 206, CTL4 enables a predetermined number of transconductance amplifiers 208 to achieve a predetermined target common mode range.

Figure 4B:
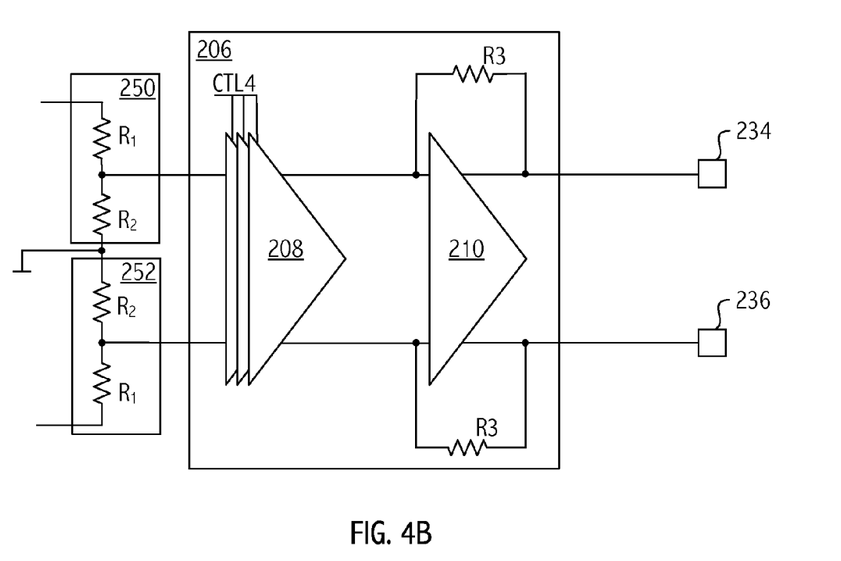

Referring to FIGS. 2 and 4B, in at least one embodiment of configurable interface 102, CTL2 selectively configures select circuits 242 and 244 to couple the input terminals of programmable gain amplifier 202 to the output of attenuator modules 250 and 252, respectively. In at least one embodiment, programmable gain amplifier 202 receives an attenuated version of the received signal. For example, a received signal having a wide common mode range is buffered by operational amplifiers 202 and 204 before being attenuated by attenuators 250 and 252, respectively, to reduce the range of the signal received by programmable gain amplifier 202. In at least one embodiment of programmable gain amplifier 206, CTL4 enables a predetermined number of transconductance amplifiers 208 to achieve a predetermined target common mode range.

Figure 5:
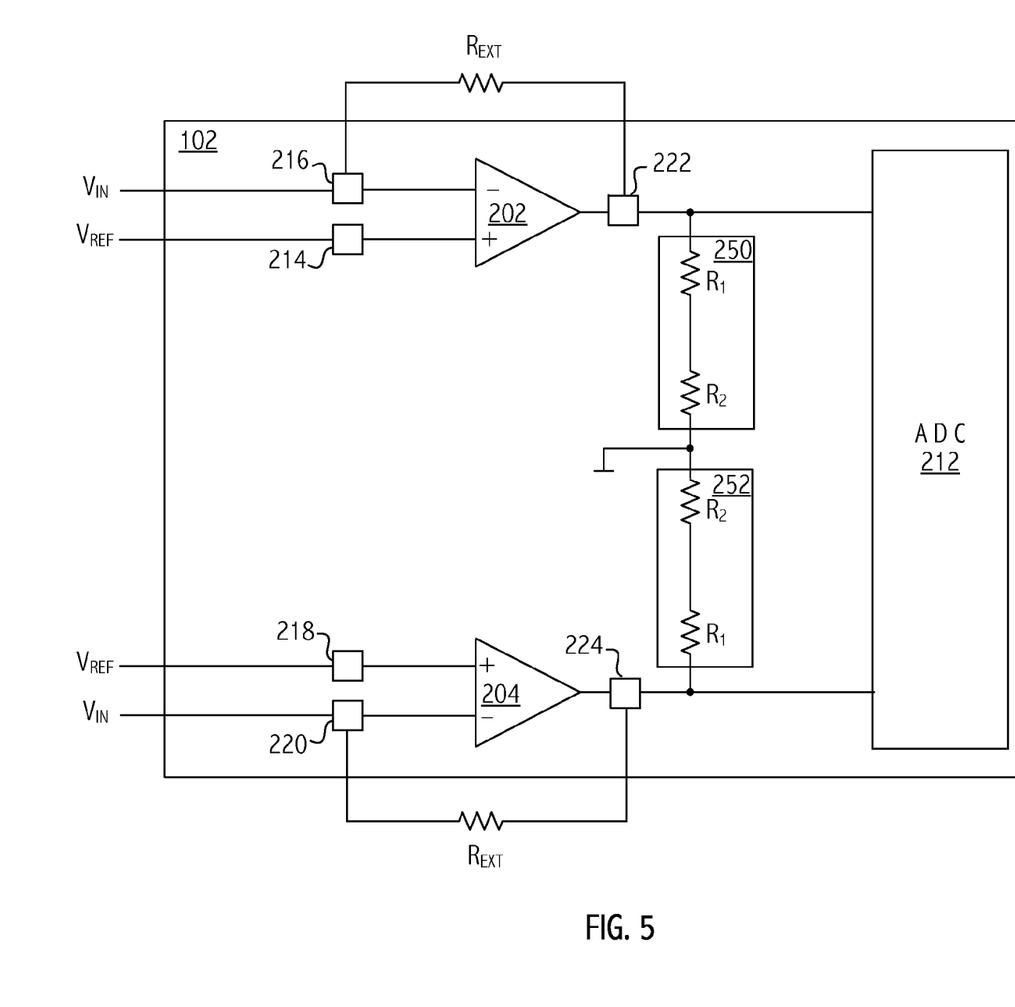
FIG. 5 illustrates a functional block diagram of the configurable interface circuit of FIG. 2 configured for operation consistent with at least one embodiment of the invention.

Referring to FIGS. 5-8, in at least one embodiment, configurable interface 102 is configurable in combination with external components to generate various different interfaces for processing input signals having various different characteristics. Referring to FIGS. 2 and 5, in at least one embodiment, configurable interface 102 is configurable to receive a current signal via pads 216 and 220, and pads 214 and 218 are configured to receive a reference voltage. An external resistor, $R_{EXT}$, is coupled between each of pads 222 and 216 and pads 224 and 220. CTL1 and multiplexers 238 and 240 configure operational amplifiers 202 and 204, respectively, as transimpedance amplifiers that convert the received current signal to a voltage signal provided by CTL3 and multiplexers 246 and 248 to ADC 212. Although programmable gain amplifier 206 is physically present in configurable interface 102, it is effectively disabled in the configuration of FIG. 5 and thus is not shown. In at least one embodiment of configurable interface 102, programmable gain amplifier 206 is physically present in embodiments of configurable interface 102 associated with FIG. 5, but is powered-down (e.g., using control signal PWR2).

Figure 6A:
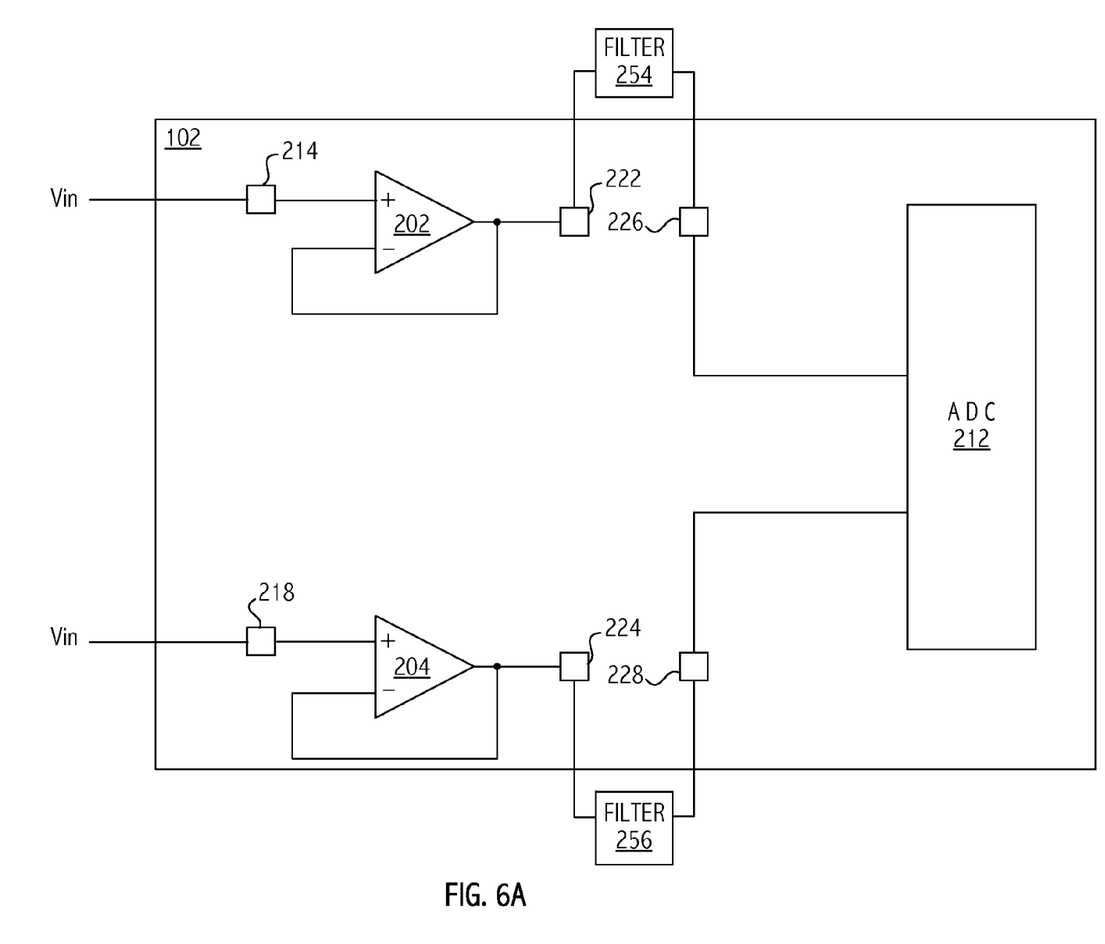
FIGS. 6A and 6B illustrate functional block diagrams of the configurable interface circuit of FIG. 2 configured for operation consistent with at least one embodiment of the invention.
Figure 6B:
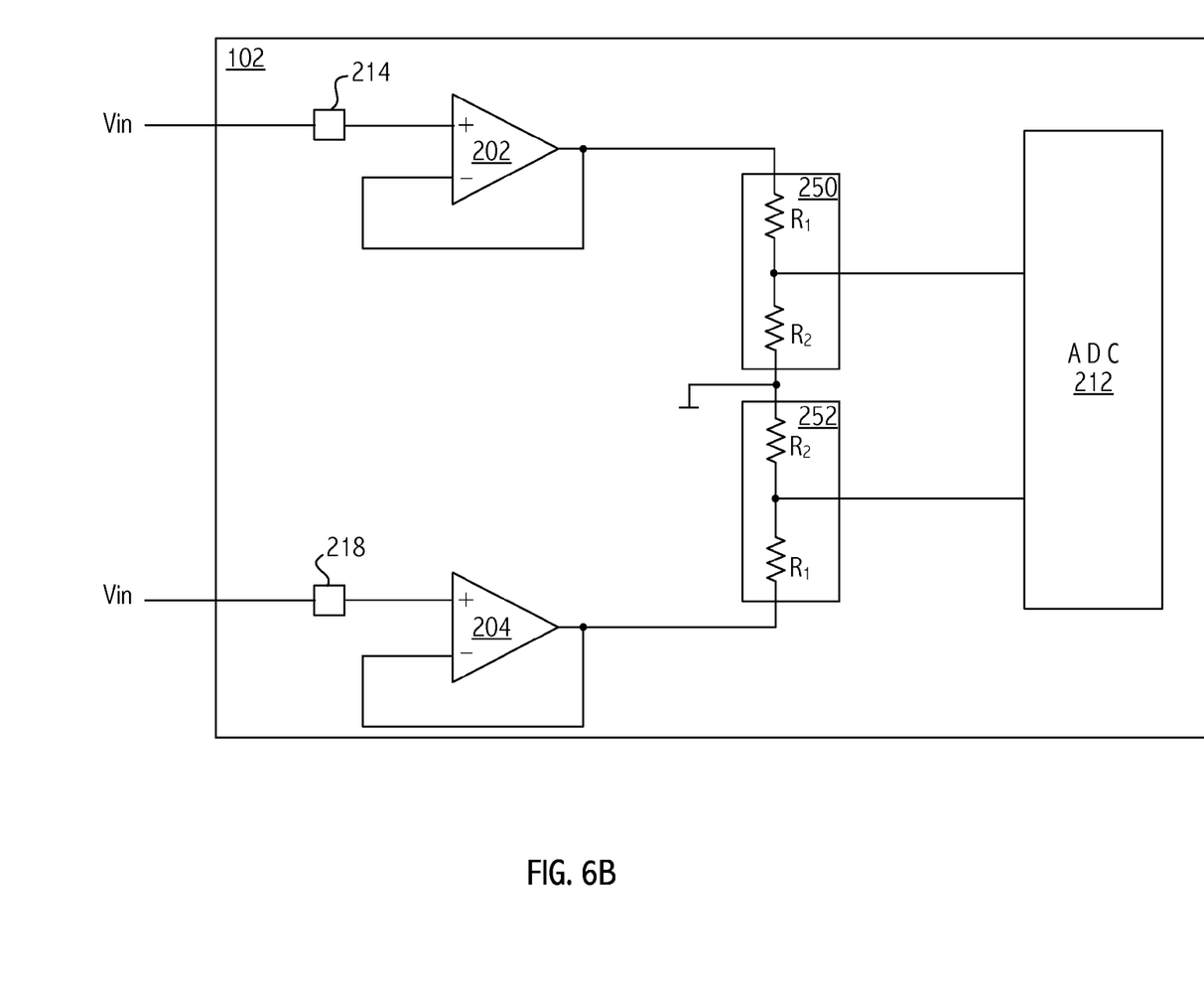

Referring to FIGS. 2, 6A, and 6B, in at least one embodiment of configurable interface 102, CTL1 and multiplexers 238 and 240 configure operational amplifiers 202 and 204 as buffer amplifiers configured to receive a voltage signal from a sensor having a high impedance at the sensor interface. Referring to FIG. 6A, in at least one embodiment of configurable interface 102, operational amplifiers 202 and 204 drive off-chip, passive filters 254 and 256 coupled between ADC 212 and operational amplifiers 202 and 204 via pads 222, 224, 226, and 228. In at least one embodiment, off-chip passive filters 254 and 256 limit the frequency-band content (e.g., remove relatively high frequencies) of the signals provided by operational amplifiers 202 and 204 and CTL3 and multiplexers 246 and 248 couple pads 226 and 228 to ADC 212. In at least one embodiment, filters 254 and 256 are included on-chip and CTL3 and multiplexers 246 and 248 couple filters 254 and 256 to operational amplifiers 202 and 204 and ADC 212. In at least one embodiment of configurable interface 102, the signals from operational amplifiers 202 and 204 are not filtered and CTL3 and multiplexers 246 and 248 couple the outputs of operational amplifiers 202 and 204, unchanged, to ADC 212, and filters 254 and 256 are excluded. In at least one embodiment of configurable interface 102, a predetermined attenuation is applied to the buffered, received signal prior to limiting the frequency-band content of the buffered, received signal, by including attenuators 250 and configuring operational amplifiers 202 and 204 consistent with the configuration of FIG. 3B. Referring to FIG. 6B, in at least one embodiment of configurable interface 102, a predetermined attenuation is applied to the buffered received signal. Accordingly, CTL3 and multiplexers 246 and 248 provide the buffered, attenuated signal to ADC 212, which is useful where the input common mode range exceeds the input range of ADC 212. Although programmable gain amplifier 206 is physically present in configurable interface 102, it is effectively disabled in the embodiments associated with FIGS. 6A and 6B and thus is not shown. In at least one embodiment of configurable interface 102, programmable gain amplifier 206 is physically present, but is powered-down (e.g., using control signal PWR2).

Figure 7:
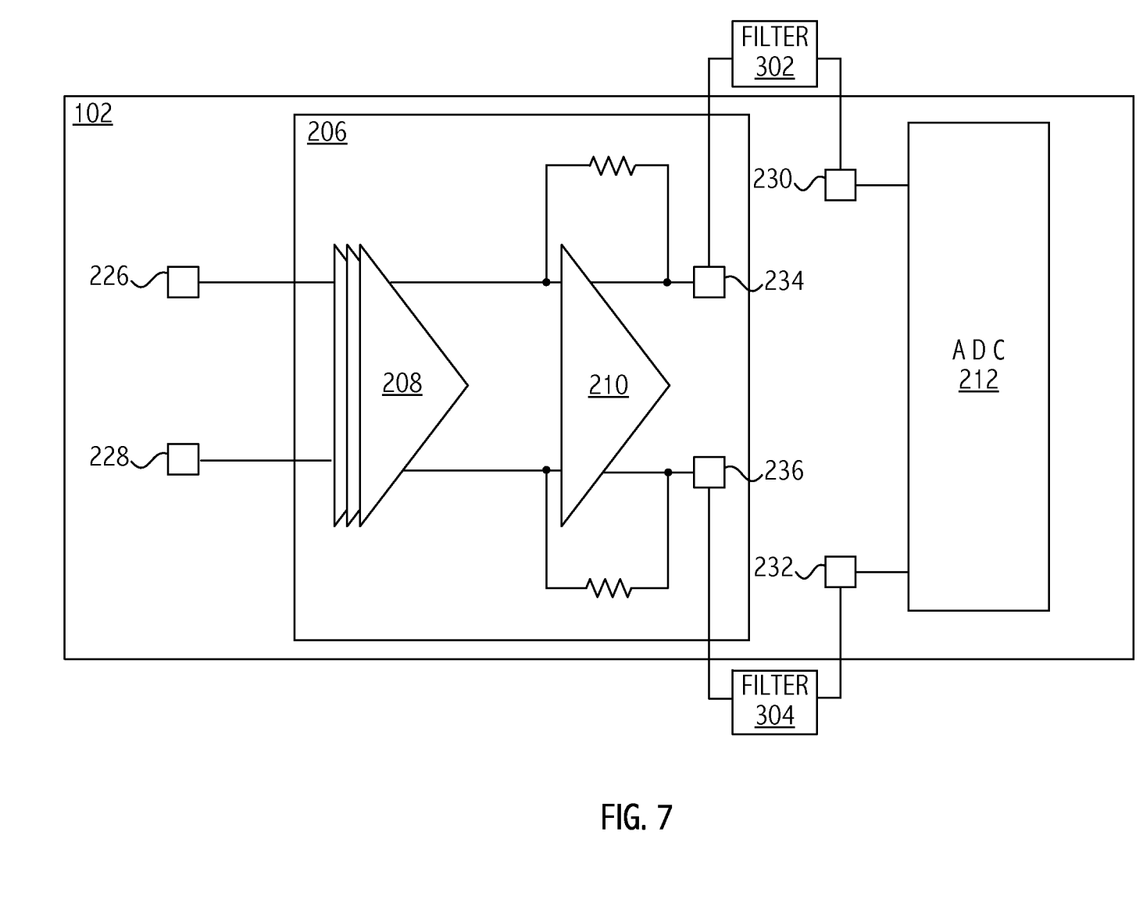
FIG. 7 illustrates a functional block diagram of the configurable interface circuit of FIG. 2 configured for operation consistent with at least one embodiment of the invention.

Referring to FIGS. 2 and 7, in at least one embodiment of configurable interface 102, CTL2 configures multiplexers 242 and 244 to receive a small signal from off-chip via pads 226 and 228 and provide it directly to programmable gain amplifier 206. In at least one embodiment, the signal is a ground-referenced signal or a small-swing signal and configurable interface 102 converts the ground-referenced signal or small-swing signal to a signal having a target common mode voltage expected by ADC 212. In at least one embodiment of configurable interface 102, the frequency band content of signals from programmable gain amplifier 206 is limited by off-chip, passive filters 302 and 304 coupled between ADC 212 and programmable gain amplifier 206 via pads 234 and 230 and pads 236 and 232, respectively. In at least one embodiment, filters 302 and 304 are included on-chip. In at least one embodiment of configurable interface 102, CTL3 and multiplexers 246 and 248 are configured to directly provide the signals from programmable gain amplifier 206 to ADC 212, and filters 302 and 304 are not included. Although operational amplifiers 202 and 204 are physically present in configurable interface 102, they are effectively disabled in the configuration of FIG. 7 and thus are not shown. In at least one embodiment of configurable interface 102, operational amplifiers 202 and 204 are physically present in embodiments of configurable interface 102 associated with FIG. 7, but are powered-down (e.g., using control signal PWR1).

Figure 8:
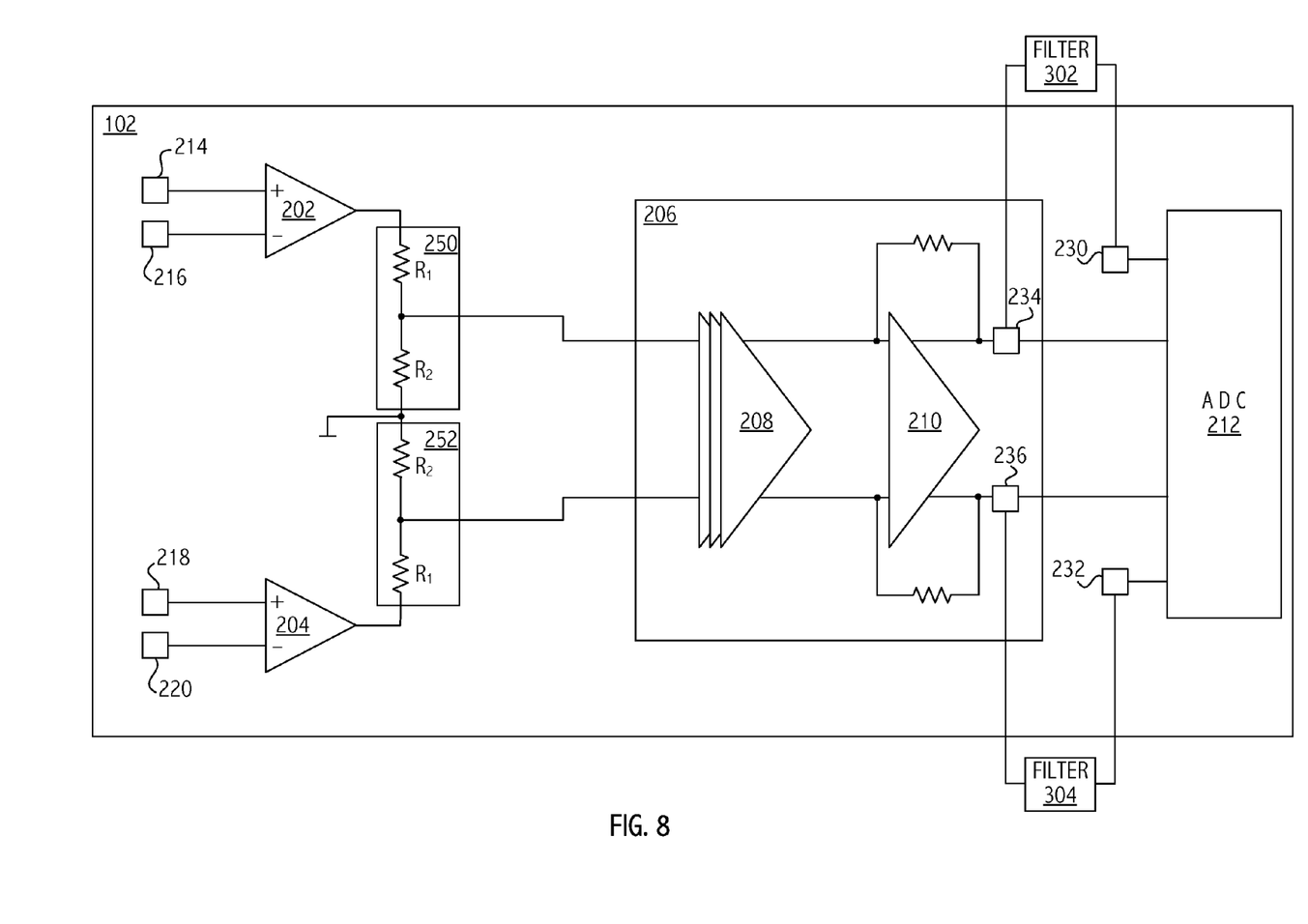
FIG. 8 illustrates a functional block diagram of the configurable interface circuit of FIG. 2 configured for operation consistent with at least one embodiment of the invention.

Referring to FIGS. 2 and 8, in at least one embodiment of configurable interface 102, CTL1 and multiplexers 238 and 240 configure operational amplifiers 202 and 204 as voltage buffer amplifiers having high input impedances to receive a wide common mode range voltage signal. CTL2 and multiplexers 242 and 244 provide a buffered, attenuated version of the received signal to programmable gain amplifier 206, which has a lower input impedance level. The buffered, attenuated version of the received signal has a common mode voltage range in a range expected by programmable gain amplifier 206. CTL4 configures programmable gain amplifier 206 to shift the common mode voltage of the buffered, attenuated version of the received signal to a common mode voltage level expected by ADC 212. In at least one embodiment of configurable interface 102, the frequency band content of signals from programmable gain amplifier 206 is limited by off-chip, passive filters 302 and 304 coupled between ADC 212 and programmable gain amplifier 206 via pads 234 and 230 and pads 236 and 232, respectively. In at least one embodiment of configurable interface 102, passive filters 302 and 304 are on-chip. In at least one embodiment of configurable interface 102, CTL3 and multiplexers 246 and 248 are configured to directly provide the signals from programmable gain amplifier 206 to ADC 212, and filters 302 and 304 are not included.

Note that the configurations of the configurable interface 102 of FIG. 2 illustrated in FIGS. 5-8 are exemplary only and various embodiments of configurable interface 102 are configurable to satisfy other interfacing specifications for a given end-use or implementation. In addition, note that additional structures included in configurable interface 102 may be included. For example, in at least one embodiment of configurable interface 102, pads 214, 216, 218, . . . , 232, are associated with other structures, e.g., output stages, and electrostatic discharge (ESD) structures (not shown in FIGS. 2-8) are coupled to those pads.

While circuits and physical structures have been generally presumed in describing embodiments of the invention, it is well recognized by persons of ordinary skill in the art that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the tangible computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in embodiments in which signals are provided to the configurable interface from sensor devices, one of skill in the art will appreciate that the teachings herein can be utilized in other applications. Variations and modifications of the embodiments disclosed herein, may be made based on the description set forth herein, without departing from the scope and spirit of the invention as set forth in the following claims.

What is claimed is:

1. An integrated circuit comprising:
a configurable interface comprising:
a first terminal of the integrated circuit configured to receive a received signal;
an operational amplifier;
a programmable gain amplifier, an input offset voltage of the programmable gain amplifier being at least two orders of magnitude less than an input offset voltage of the operational amplifier;
an attenuator circuit coupled to an output of the operational amplifier and selectively coupled to an input of the programmable gain amplifier;
an analog-to-digital converter;
a first select circuit configured to selectively couple the operational amplifier to the analog-to-digital converter in response to a first control signal, the first select circuit further configured to selectively couple the programmable gain amplifier to the analog-to-digital converter in response to the first control signal,
a second select circuit configured to selectively couple an input of the operational amplifier to receive a signal on an inverting terminal of the operational amplifier in response to a second control signal; and
a third select circuit configured to selectively provide a signal to an input of the programmable gain amplifier in response to a third control signal,
wherein in a first mode of the configurable interface, the first control signal configures the first select circuit to couple the programmable gain amplifier to the analog-to-digital converter,
wherein in a second mode of the configurable interface, the first control signal configures the first select circuit to couple the operational amplifier to the analog-to-digital converter, and
wherein in a third mode of the configurable interface, the first control signal configures the first select circuit to couple the programmable gain amplifier to the analog-to-digital converter and the third control signal configures the third select circuit to couple an output of the operational amplifier to the input of the programmable gain amplifier via the attenuator circuit.

2. The integrated circuit, as recited in claim 1, wherein the first select circuit is further configured to selectively couple the first terminal of the integrated circuit to the analog-to-digital converter in response to the first control signal.

3. The integrated circuit, as recited in claim 1, wherein the second select circuit is further configured to selectively couple an output of the operational amplifier to an inverting input terminal of the operational amplifier in response to the second control signal, the second select circuit being further configured to selectively couple the inverting input terminal of the operational amplifier to the first terminal of the integrated circuit in response to the second control signal, and the second select circuit being further configured to selectively couple the inverting input terminal of the operational amplifier to an output of the attenuator in response to the second control signal.

4. The integrated circuit, as recited in claim 3, wherein a first value of the second control signal configures the operational amplifier as a unity gain buffer, a second value of the second control signal configures the operational amplifier as a transimpedance amplifier or comparator, and a third value of the second control signal configures the operational amplifier as a non-inverting amplifier.

5. The integrated circuit, as recited in claim 3, wherein the configurable interface further comprises:
a second terminal of the integrated circuit coupled to the output of the operational amplifier,
wherein the second control signal configures the operational amplifier as a transimpedance amplifier.

6. The integrated circuit, as recited in claim 3, wherein the configurable interface further comprises:
a second terminal,
wherein the third select circuit is configured to selectively couple the input of the programmable gain amplifier to the second terminal of the integrated circuit in response to the third control signal.

7. The integrated circuit, as recited in claim 1, wherein the operational amplifier has a high input impedance, and the programmable gain amplifier is a DC-stabilized amplifier.

8. The integrated circuit, as recited in claim 1, wherein an input offset voltage of the programmable gain amplifier is at least two orders of magnitude less than an input offset voltage of the operational amplifier.

9. The integrated circuit, as recited in claim 1, wherein the programmable gain amplifier comprises:
a current-to-voltage converter amplifier; and
a plurality of transconductance amplifiers selectively coupled to the current-to-voltage converter amplifier.

10. A method comprising:
in a first mode of operation, processing a received signal using a first amplifier and providing a first processed version of the received signal to an analog-to-digital converter, a second amplifier being effectively disabled;
in a second mode of operation, processing the received signal using the second amplifier and providing a second processed version of the received signal to the analog-to-digital converter, the first amplifier being effectively disabled; and
in a third mode of operation, processing the received signal using the first amplifier in series with the second amplifier and providing a third processed version of the received signal to the analog-to-digital converter, the second amplifier having an input offset voltage at least two orders of magnitude less than an input offset voltage of the first amplifier.

11. The method, as recited in claim 10, further comprising:
in the first mode of operation, powering off the second amplifier; and
in the second mode of operation, powering off the first amplifier.

12. The method, as recited in claim 10, further comprising:
configuring the first amplifier as a transimpedance amplifier,
wherein in the first mode of operation, the processing comprises converting the received signal from a current to a voltage.

13. The method, as recited in claim 10, further comprising:
configuring the first amplifier as a buffer,
wherein in the first mode of operation, the processing comprises buffering the received signal.

14. The method, as recited in claim 10, further comprising:
configuring the second amplifier to amplify the received signal by a predetermined gain,
wherein in the second mode of operation, the processing comprises amplifying the received signal by the predetermined gain.

15. The method, as recited in claim 10, wherein in the second mode of operation, the received signal is a ground-referenced signal.

16. The method, as recited in claim 10, further comprising:
configuring the first amplifier as a buffer and configuring the second amplifier as an amplifier having a predetermined gain;
in the third mode of operation, wherein the processing comprises:
buffering the received signal to generate a buffered received signal;
attenuating the buffered received signal to generate an attenuated, buffered received signal; and
amplifying the attenuated, buffered received signal by the predetermined gain.

17. The method, as recited in claim 10,
in the first mode of operation, providing externally to an integrated circuit including the first amplifier and the second amplifier, an output of the first amplifier and providing a second received signal to the analog-to-digital converter.

18. The method, as recited in claim 10,
in the second mode of operation, providing externally to an integrated circuit including the first amplifier and the second amplifier, an output of the second amplifier and providing a second received signal to the analog-to-digital converter.

19. The method, as recited in claim 10,
wherein in the first mode, the received signal is one of a current signal and a large voltage signal,
wherein in the second mode, the received signal is a ground-referenced signal, and
wherein in the third mode, the received signal is a wide swing, common mode signal.

20. An analog front end comprising:
an analog-to-digital converter;
a first amplifier; and
a second amplifier,
wherein in a first mode of operation, the first amplifier processes a received signal and provides a first processed version of the received signal to the analog-to-digital converter, the second amplifier being effectively disabled,
wherein in a second mode of operation, the second amplifier processes the received signal and provides a second processed version of the received signal to the analog-to-digital converter, the first amplifier being effectively disabled,
wherein in a third mode of operation, the first amplifier processes the received signal in series with the second amplifier and provides a third processed version of the received signal to the analog-to-digital converter, and
wherein the second amplifier has an input offset voltage at least two orders of magnitude less than an input offset voltage of the first amplifier.

* * * * *